US012604116B2

(12) United States Patent
Yoshimura et al.

(10) Patent No.: US 12,604,116 B2
(45) Date of Patent: Apr. 14, 2026

(54) CLOCK TRANSMISSION CIRCUIT, IMAGING ELEMENT, AND METHOD FOR MANUFACTURING CLOCK TRANSMISSION CIRCUIT

(71) Applicant: HAMAMATSU PHOTONICS K.K., Hamamatsu (JP)

(72) Inventors: Hidetoshi Yoshimura, Hamamatsu (JP); Tasuku Joboji, Hamamatsu (JP); Yukinobu Sugiyama, Hamamatsu (JP); Riku Yonekawa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 55 days.

(21) Appl. No.: 18/711,253

(22) PCT Filed: Sep. 29, 2022

(86) PCT No.: PCT/JP2022/036575
§ 371 (c)(1),
(2) Date: May 17, 2024

(87) PCT Pub. No.: WO2023/089964
PCT Pub. Date: May 25, 2023

(65) Prior Publication Data
US 2025/0008241 A1      Jan. 2, 2025

(30) Foreign Application Priority Data

Nov. 22, 2021      (JP) ................................. 2021-189281

(51) Int. Cl.
H04N 25/76          (2023.01)
G06F 1/10            (2006.01)
(Continued)

(52) U.S. Cl.
CPC .......... H04N 25/7795 (2023.01); G06F 1/10 (2013.01); H03K 5/1506 (2013.01); H04N 25/78 (2023.01)

(58) Field of Classification Search
None
See application file for complete search history.

(56) References Cited

U.S. PATENT DOCUMENTS 6,255,884  B1      7/2001  Lewyn
2003/0218480 A1    11/2003  Swami et al.
(Continued)

FOREIGN PATENT DOCUMENTS

JP          2000-243939 A      9/2000
JP          2001-110708 A      4/2001
(Continued)

OTHER PUBLICATIONS

English-language translation of International Preliminary Report on Patentability (IPRP) dated Jun. 6, 2024 that issued in WO Patent Application No. PCT/JP2022/036575.

*Primary Examiner* — Paul M Berardesca
(74) *Attorney, Agent, or Firm* — Faegre Drinker Biddle & Reath LLP

(57)          ABSTRACT

A clock transmission circuit includes a plurality of circuit regions that have common circuit patterns and are arranged along one direction. Each of the circuit patterns of the plurality of circuit regions has at least two circuit elements that are switchable between a high impedance state and a pass state, and wirings that are connected to the circuit patterns of circuit regions adjacent to concerned circuit region, among the plurality of circuit regions. States of the at least two circuit elements of the plurality of circuit regions are controlled to be predetermined states determined for (Continued)

each circuit region, so that at least a part of a clock tree crossing the plurality of circuit regions is configured.

18 Claims, 14 Drawing Sheets

(51) Int. Cl.
  *H03K 5/15*          (2006.01)
  *H04N 25/78*         (2023.01)

(56)                References Cited

U.S. PATENT DOCUMENTS

| | | | |
|---|---|---|---|
| 2012/0305752 A1* | 12/2012 | Shimizu | H04N 25/617 |
| | | | 250/208.1 |
| 2016/0164508 A1 | 6/2016 | Ma | |
| 2019/0081619 A1 | 3/2019 | Kim et al. | |
| 2021/0067723 A1* | 3/2021 | Kim | H04N 25/46 |

FOREIGN PATENT DOCUMENTS

| | | | |
|---|---|---|---|
| JP | 2001-154371 A | 6/2001 | |
| JP | 2007-060036 A | 3/2007 | |
| JP | 2007288788 A | 11/2007 | |
| JP | 2016506106 A | 2/2016 | |
| WO | 2014077910 A1 | 5/2014 | |
| WO | 2020241048 A1 | 12/2020 | |

* cited by examiner (a)

W

40

40

40

40

40

40

D2

D1

40

IIIc

IIIc (b)   B   A   A   A   A   A   A   A   A   C

43

42   41   41   41   41   41   41   41   41

44

44

42   41   41   41   41   41   41   41   41

43

(c)

62

(c)

(b)

(a)

CLOCK TRANSMISSION CIRCUIT, IMAGING ELEMENT, AND METHOD FOR MANUFACTURING CLOCK TRANSMISSION CIRCUIT

TECHNICAL FIELD

The present disclosure relates to a clock transmission circuit, an imaging element, and a method for manufacturing a clock transmission circuit.

BACKGROUND ART

Patent Literature 1 discloses a buffering technique using a structured delay skew. Patent Literature 1 describes a tree structure routing method. Patent Literature 2 discloses a technique regarding an exposure apparatus that forms a desired pattern on a substrate while performing lap-stitch exposure on a part of a projection image of a pattern formed on a reticle. Patent Literature 3 describes that stitch exposure is performed in manufacturing a display device of a large-sized display.

CITATION LIST

Patent Literature

[Patent Literature 1] Japanese Unexamined Patent Publication No. 2007-060036
[Patent Literature 2] Japanese Unexamined Patent Publication No. 2001-110708
[Patent Literature 3] Japanese Unexamined Patent Publication No. 2001-154371

SUMMARY OF INVENTION

Technical Problem

In propagation of a clock signal inside a semiconductor element, the clock signal is delayed according to a length and a load of a clock wiring. Accordingly, when the clock signal is to be input to many circuits at the same timing, a clock tree is used. In the clock tree, it is desirable to repeatedly branch the clock signal bilaterally symmetrically in relation to a center position of a circuit group as a clock supply destination.

On the other hand, in a photolithography process in manufacturing a large-area semiconductor element, a plurality of shots having a common exposure pattern may be stitched into one element. This technique is referred to as stitch exposure. When a semiconductor element is manufactured by the stitch exposure, a plurality of circuit regions having the same circuit pattern are arranged. Accordingly, while a clock tree is easily formed in each circuit region, a clock tree crossing a plurality of circuit regions is difficult to form. Therefore, there is a problem in that the clock signal is delayed among a plurality of circuit regions.

An object of the present disclosure is to provide a clock transmission circuit capable of forming a clock tree crossing a plurality of circuit regions having the same circuit pattern, and a method for manufacturing a clock transmission circuit. An object of the present disclosure is to provide an imaging element with less delay of a clock signal.

Solution to Problem

A clock transmission circuit of the present disclosure is a clock transmission circuit including a clock tree provided on a single substrate. The clock transmission circuit includes a plurality of circuit regions that have common circuit patterns and are arranged in one direction. The circuit pattern of each of the plurality of circuit regions has at least two circuit elements that are switchable between a high impedance state and a pass state, and wirings that are connected to the circuit patterns of circuit regions adjacent to concerned circuit region, among the plurality of circuit regions. States of the at least two circuit elements of the plurality of circuit regions are controlled to be predetermined states determined for each circuit region, so that at least a part of the clock tree crossing the plurality of circuit regions is configured.

A method for manufacturing a clock transmission circuit according to the present disclosure is a method for manufacturing a clock transmission circuit including a clock tree provided on a single substrate. The method for manufacturing a clock transmission circuit includes a step of performing stitch exposure using a common exposure pattern to form a plurality of circuit regions that have common circuit patterns and are arranged in one direction. The circuit pattern of each of the plurality of circuit regions has at least two circuit elements that are switchable between a high impedance state and a pass state, and wirings that are connected to the circuit patterns of circuit regions adjacent to concerned circuit region, among the plurality of circuit region. States of the at least two circuit elements of the plurality of circuit regions are controlled to be predetermined states determined for each circuit region, so that at least a part of the clock tree crossing the plurality of circuit regions is configured.

With the clock transmission circuit and the method for manufacturing a clock transmission circuit, the clock tree that crosses a plurality of circuit regions having the same circuit pattern can be formed. Therefore, delay of a clock signal among the plurality of circuit regions can be reduced.

In the clock transmission circuit and the method for manufacturing a clock transmission circuit described above, the circuit pattern may include a plurality of stages of circuit portions configured to take on a plurality of stages of branches of the clock tree, respectively. In this case, the branch of each stage of the clock tree can be suitably implemented by the circuit portions of the respective stages.

In the clock transmission circuit and the method for manufacturing a clock transmission circuit described above, one circuit portion among the plurality of stages of circuit portions may include first and second circuit elements that are included in the at least two circuit elements and have output ends connected to each other. Then, the wirings may include a first wiring portion for connecting an input end of the first circuit element, to an input end of the second circuit element of a circuit region adjacent to one side of the concerned circuit region, among the plurality of circuit regions, and a second wiring portion for connecting an input end of the second circuit element, to an input end of the first circuit element of a circuit region adjacent to the other side of the concerned circuit region, among the plurality of circuit regions. When the clock signal propagates through the circuit portion, the circuit portion can receive the clock signal from the first wiring portion or the second wiring portion and can output the clock signal from the first node between the output end of the first circuit element and the output end of the second circuit element. Therefore, the circuit portion can be simply implemented.

In the clock transmission circuit and the method for manufacturing a clock transmission circuit described above, at least one circuit portion among the plurality of stages of circuit portions may include third, fourth, and fifth circuit elements that are included in the at least two circuit elements. Then, an output end of the third circuit element, an input end of the fourth circuit element, and an input end of the fifth circuit element may be connected to a second node, and an input end of the third circuit element and an output end of the fourth circuit element may be connected to a third node. Then, the wirings may include a third wiring portion for connecting the second node, to the third node of a circuit region adjacent to one side of the concerned circuit region, among the plurality of circuit regions, and a fourth wiring portion for connecting the third node, to the second node of a circuit region adjacent to the other side of the concerned circuit region, among the plurality of circuit regions. When the clock signal propagates through the circuit portion, the circuit portion can receive the clock signal at the third node and can output the clock signal from the output end of the fifth circuit element as necessary. The propagation direction of the clock signal can be controlled by controlling the states of the third and fourth circuit elements. Therefore, in particular, the initial stage or middle stage circuit portion can be simply implemented.

In the clock transmission circuit and the method for manufacturing a clock transmission circuit described above, the at least two circuit elements may be a TRI-STATE (Registered Trademark) type. In this case, each of the at least two circuit elements can be simply configured with a single functional portion. Because an output resistance value in the pass state of the circuit elements can be reduced to be low, the delay of the clock signal due to the resistance values of the circuit elements can be reduced.

In the clock transmission circuit and the method for manufacturing a clock transmission circuit described above, among the at least two circuit elements, the circuit element that configures at least a final stage circuit portion may be a TRI-STATE type, and an output end of the circuit element may be connected to one or both of a pull-up resistor and a pull-down resistor. Alternatively, in the clock transmission circuit and the method for manufacturing a clock transmission circuit described above, among the at least two circuit elements, the circuit element that configures at least a final stage circuit portion may include a logic circuit. With any configuration, a signal level to a clock supply destination becoming unstable can be suppressed, thereby preventing an erroneous operation of the clock supply destination.

An imaging element according to the present disclosure includes a pixel array including a plurality of pixels arranged in a one-dimensional or two-dimensional manner, an analog/digital converter array including a plurality of analog/digital converters configured to convert a plurality of analog signals output from the plurality of pixels into digital signals, respectively, a memory array having a plurality of storage regions configured to store a plurality of digital signals output from the analog/digital converter array, respectively, and a horizontal scanning circuit configured to sequentially output the plurality of digital signals stored in the memory array, as a serial signal. At least one of the analog/digital converter array and the horizontal scanning circuit receives supply of a clock signal via any clock transmission circuit described above. With the imaging element, the delay of the clock signal among a plurality of digital signals can be reduced. Therefore, a frequency of errors in reading a serial signal can be reduced.

Advantageous Effects of Invention

According to the present disclosure, a clock transmission circuit and a method for manufacturing a clock transmission circuit capable of forming a clock tree that crosses a plurality of circuit regions having the same circuit pattern can be provided. According to the present disclosure, an imaging element with less delay of a clock signal can be provided.

Figure 3:
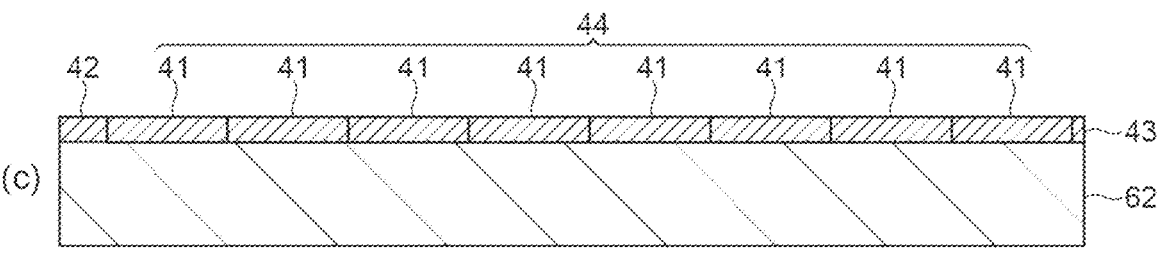

Part (a) of FIG. 3 is a plan view illustrating a circuit forming surface of a wafer after exposure and development. Part (b) of FIG. 3 is a diagram illustrating a part of Part (a) of FIG. 3 on an enlarged scale. Part (c) of FIG. 3 is a diagram illustrating a cross section taken along line IIIc-IIIc of Part (b) of FIG. 3.

Figure 4:
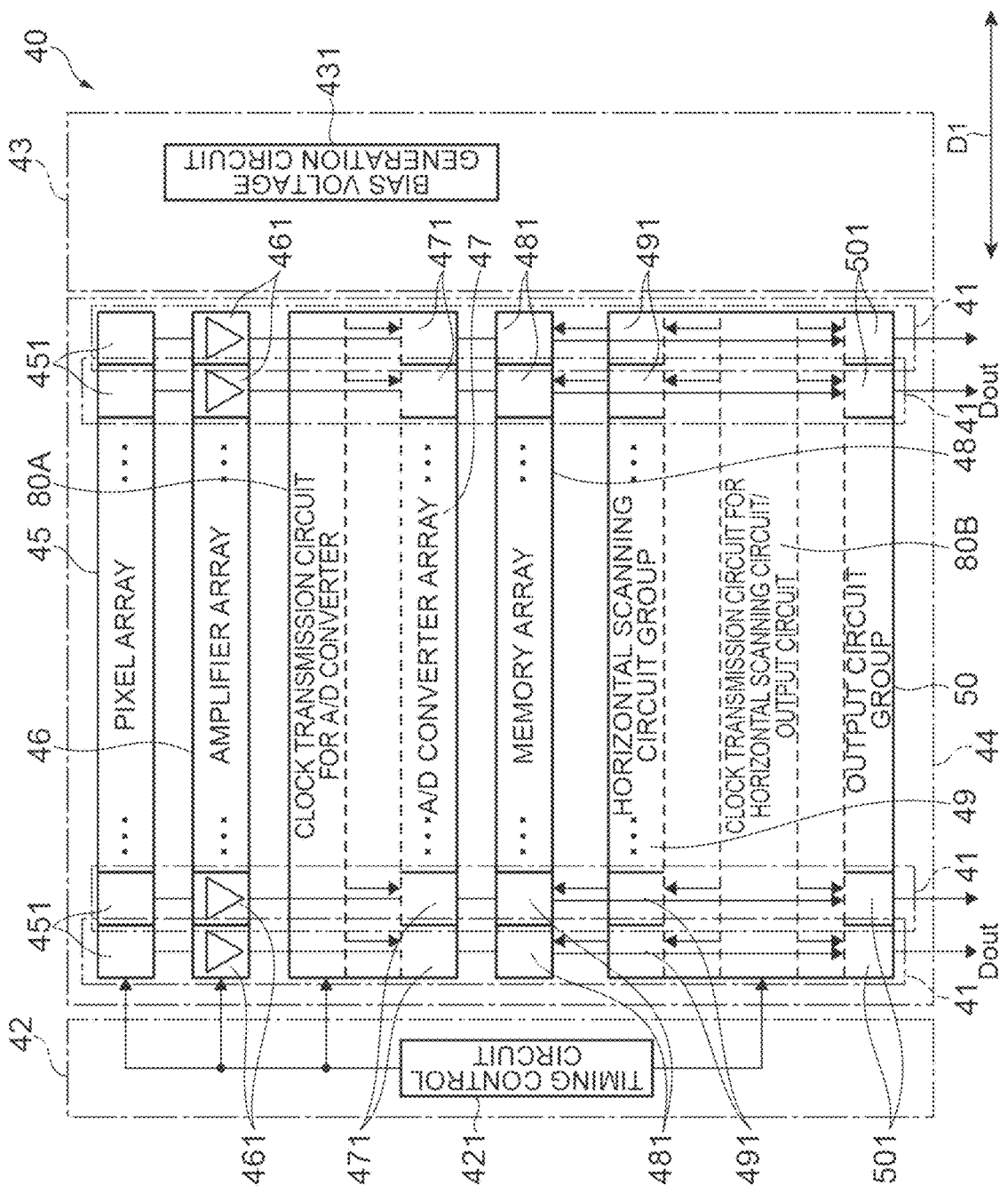

FIG. 4 is a diagram illustrating a specific configuration example of each of a plurality of imaging elements.

Figure 5:
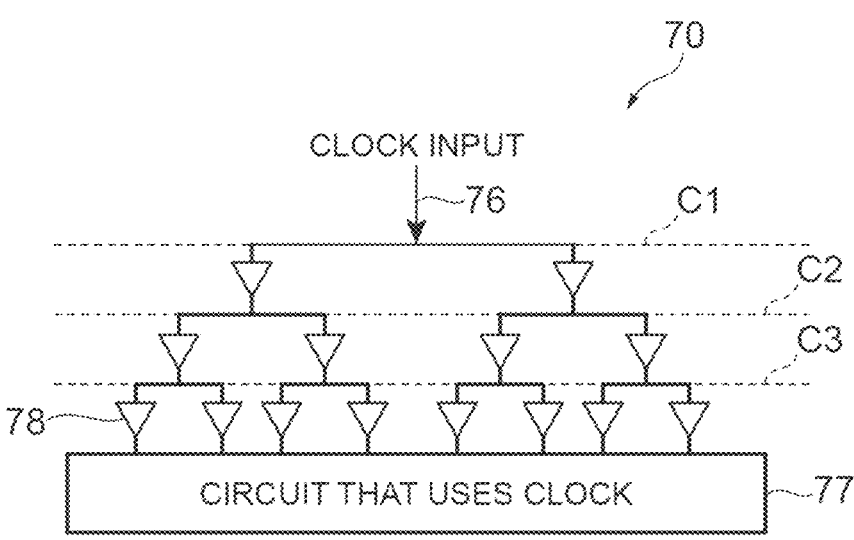

FIG. 5 is a diagram schematically illustrating a configuration of a clock tree.

Figure 6:
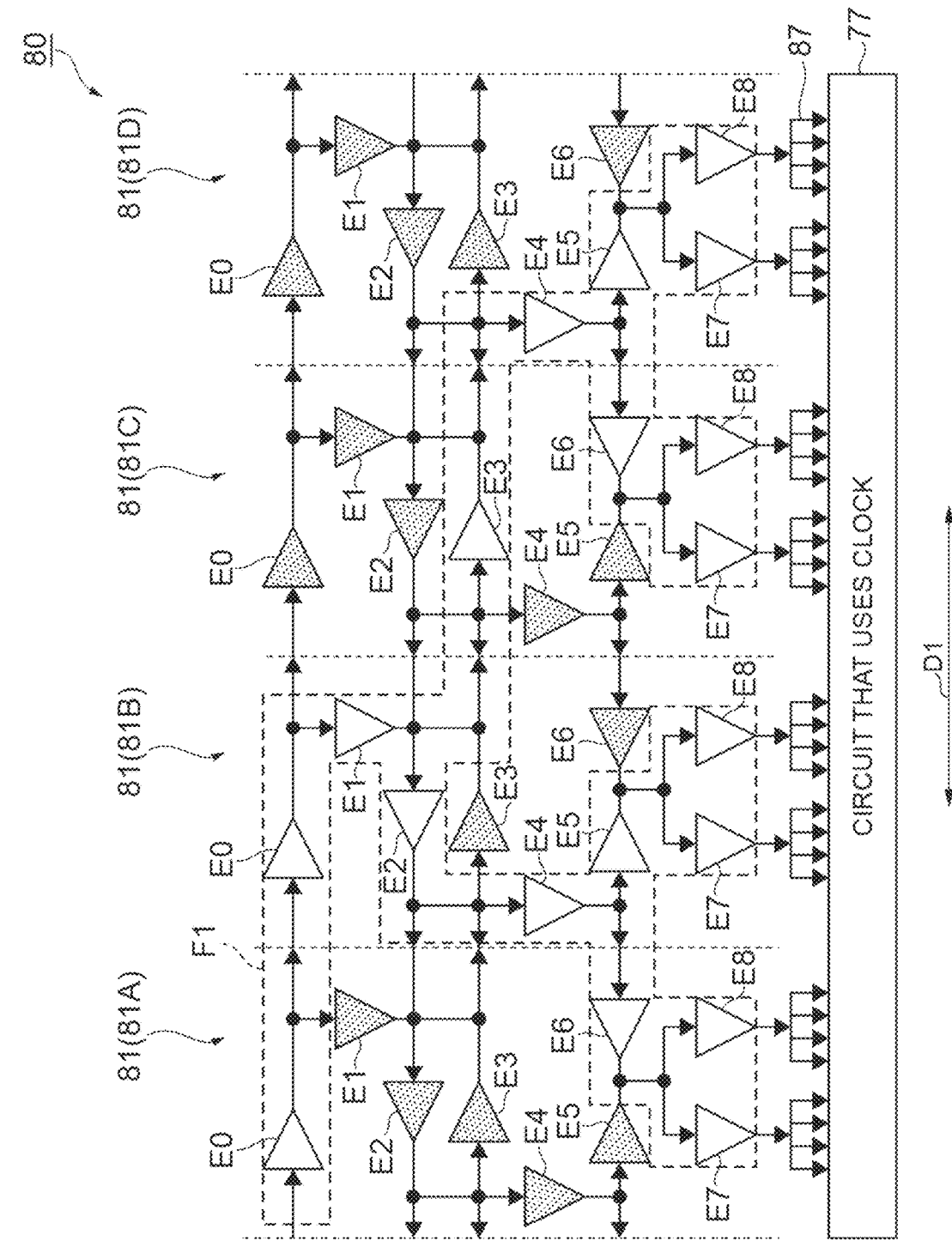

FIG. 6 is a circuit diagram illustrating a configuration of a clock transmission circuit.

Figure 7:
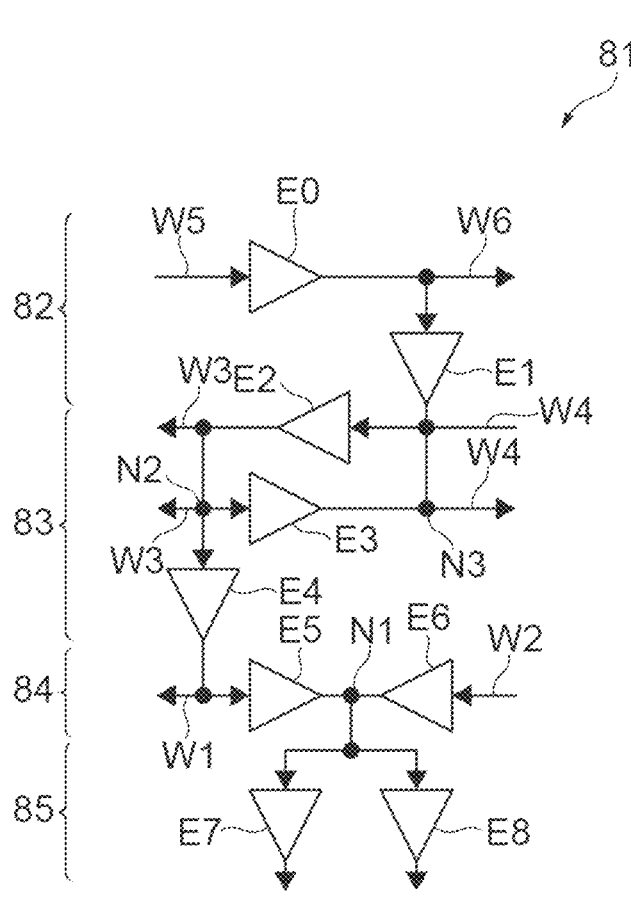

FIG. 7 is a circuit diagram illustrating a circuit pattern of each circuit region.

Figure 8:
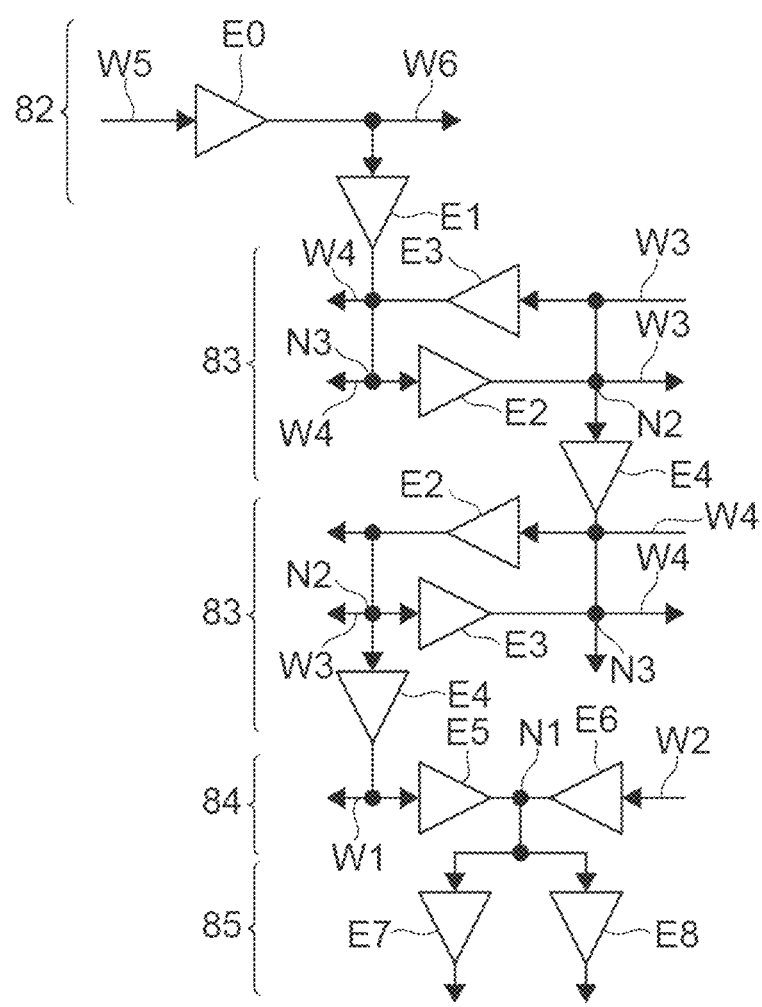

FIG. 8 is a circuit diagram illustrating another example of a circuit pattern of each circuit region.

Figure 9:
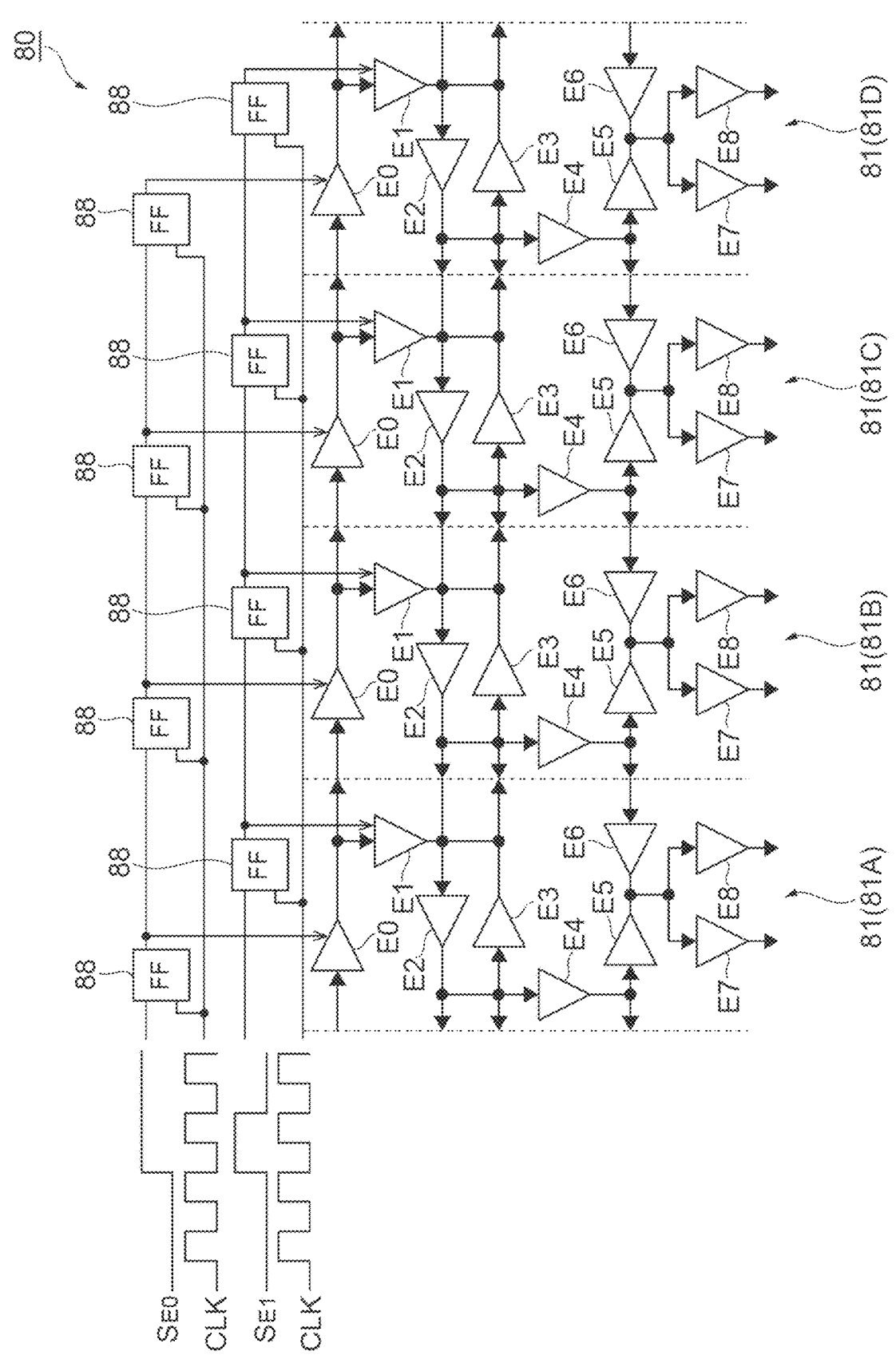

FIG. 9 is a circuit diagram illustrating an example of a circuit that controls circuit elements of each circuit region.

Figure 10:
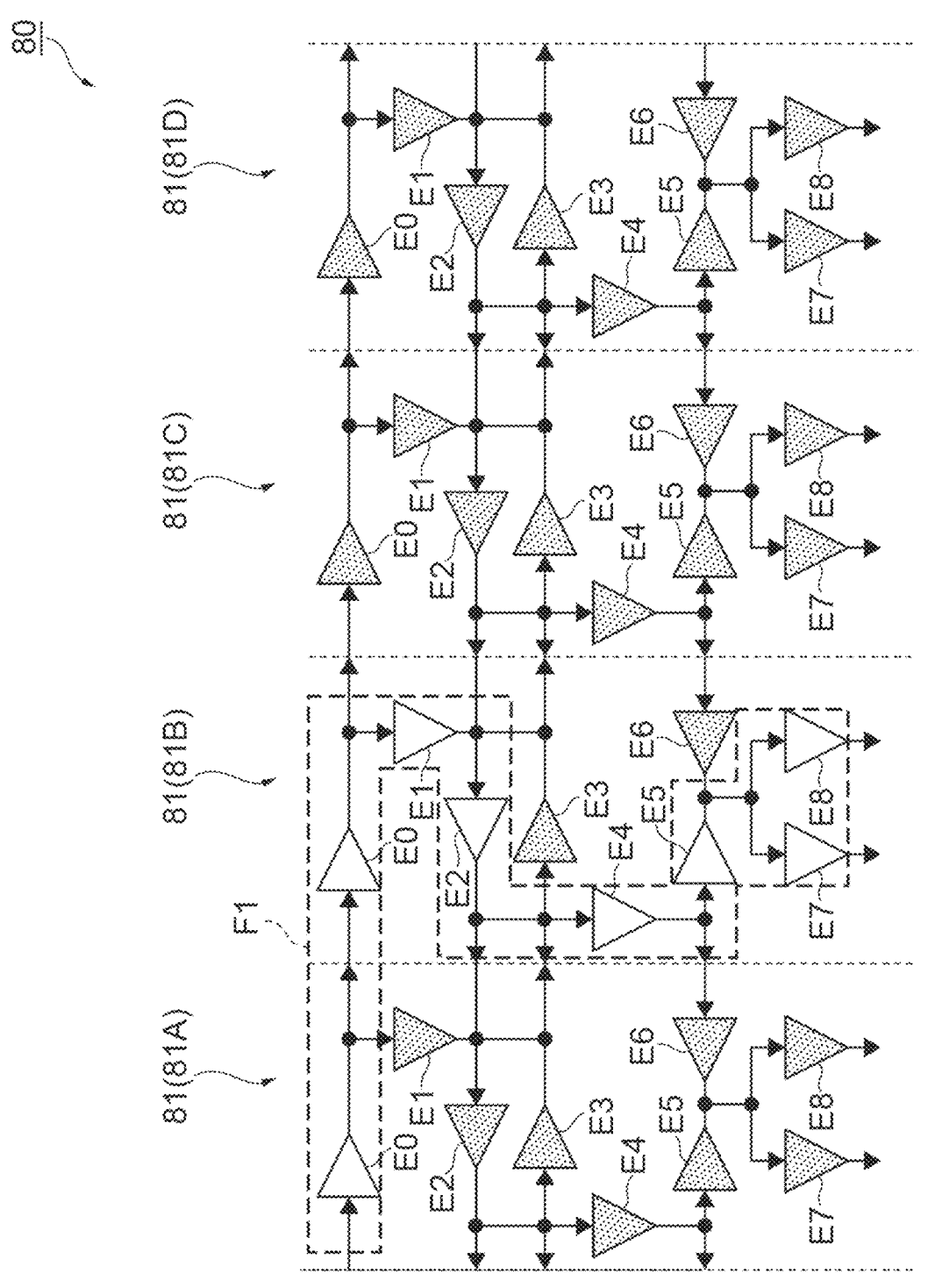

FIG. 10 is a diagram illustrating another control example of a clock transmission circuit.

Figure 11:
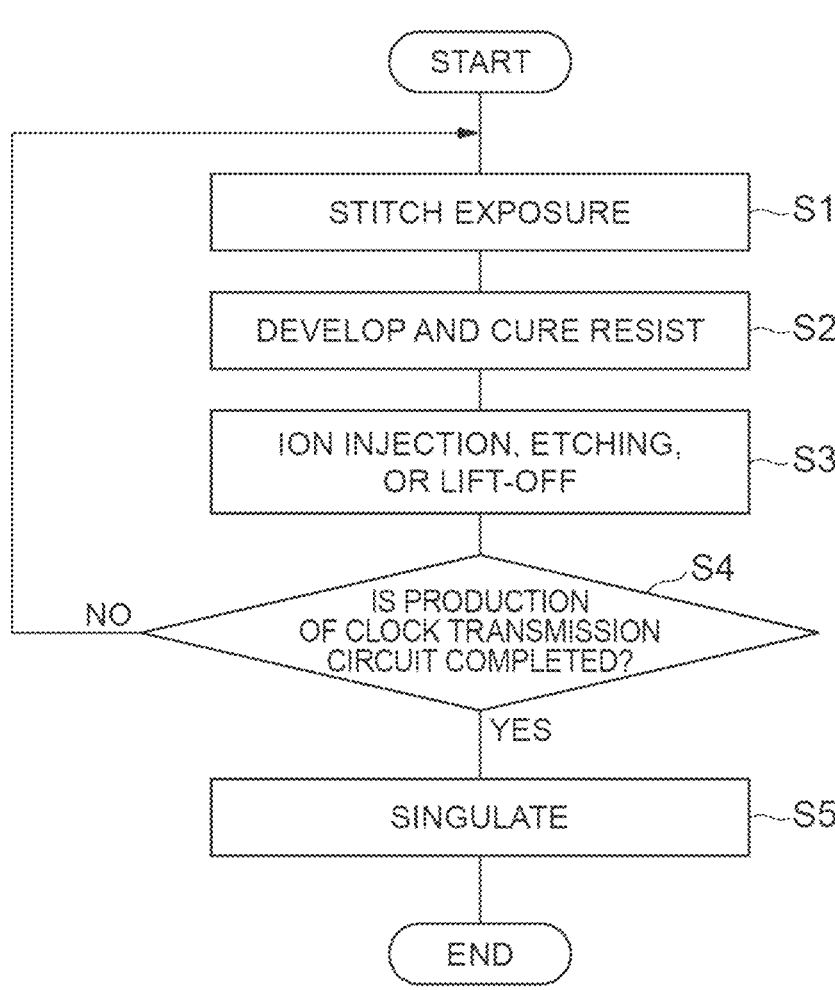

FIG. 11 is a flowchart illustrating a method for manufacturing a clock transmission circuit according to an embodiment.

Figure 12:
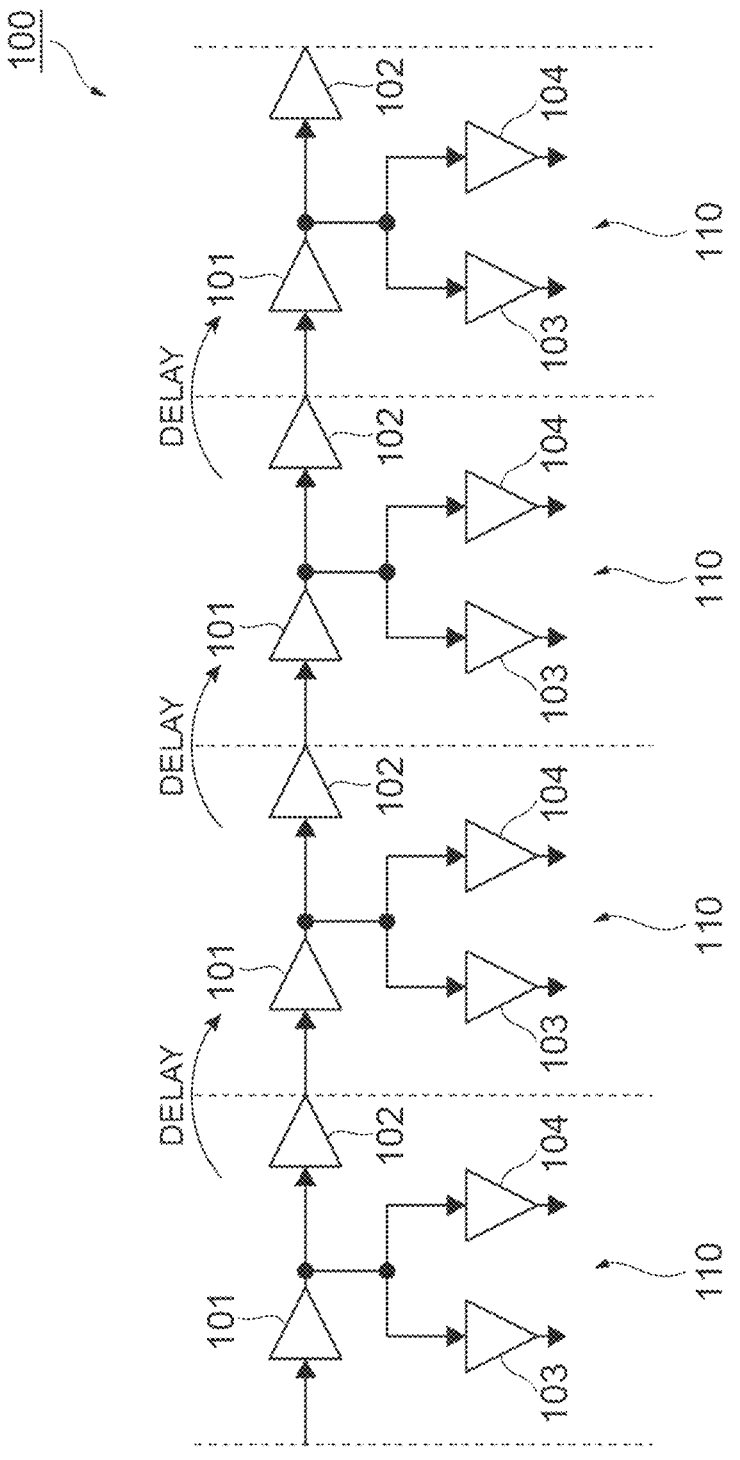

FIG. 12 is a diagram schematically illustrating a clock transmission circuit as a reference example.

Figure 13:
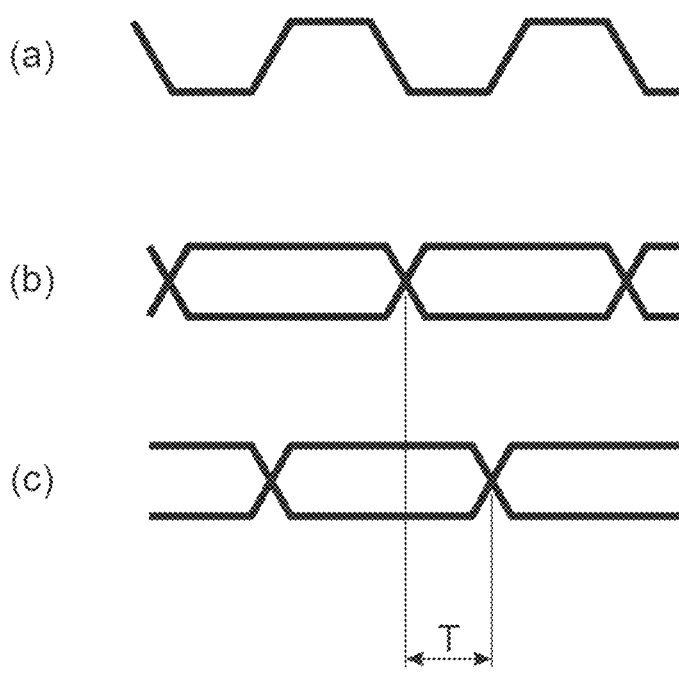

FIG. 13 is a diagram illustrating an influence of delay of a clock signal. Part (a) of FIG. 13 illustrates a clock signal that is input to one end of a series circuit. Part (b) of FIG. 13 illustrates an example of a serial signal that is output from a circuit to be driven by a clock signal output from a circuit region close to one end of the series circuit. Part (c) of FIG. 13 illustrates an example of a serial signal that is output from a circuit to be driven by a clock signal output a circuit region far from one end of the series circuit.

Figure 14:
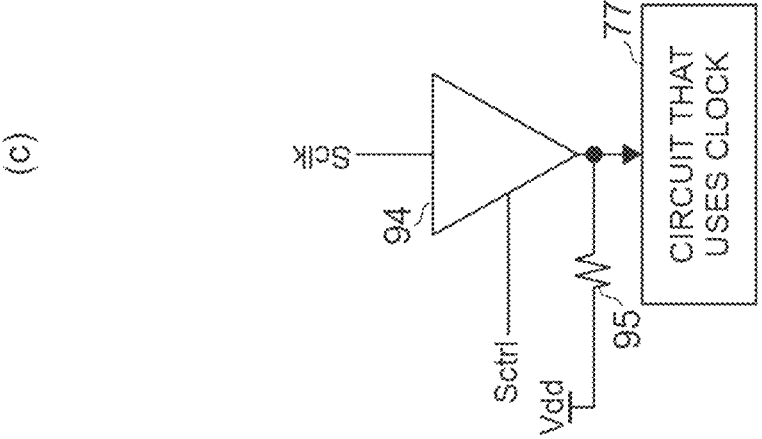
Figure 14:
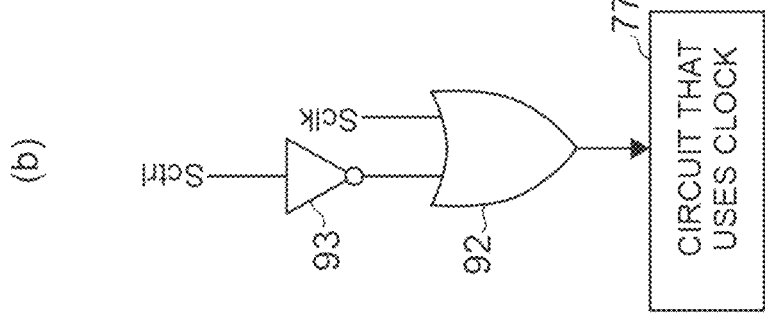
Figure 14:
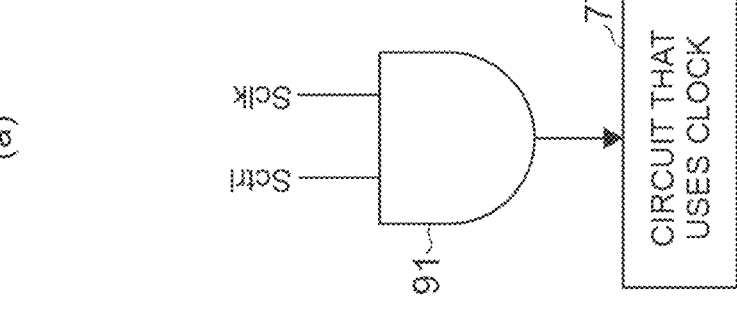

Parts (a), (b), and (c) of FIG. 14 are circuit diagrams illustrating a configuration example of a circuit element.

DESCRIPTION OF EMBODIMENTS

Hereinafter, an embodiment of a clock transmission circuit, an imaging element, and a method for manufacturing a clock transmission circuit according to the present disclosure will be described in detail with reference to the accompanying drawings. In the description of the drawings, the same elements are represented by the same reference numerals, and redundant description will not be repeated.

Figure 1:
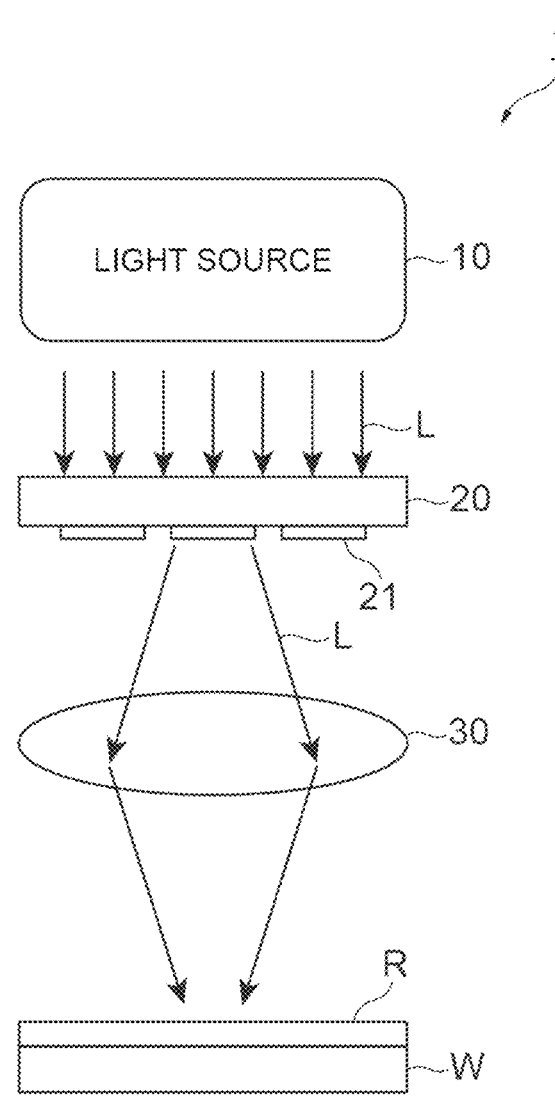
FIG. 1 is a side view schematically illustrating a configuration of an exposure apparatus that is used to manufacture an imaging element, according to an embodiment.

FIG. 1 is a side view schematically illustrating a configuration of an exposure apparatus 1 that is used to manufacture an imaging element, according to an embodiment of the present disclosure. As illustrated in FIG. 1, the exposure apparatus 1 is an apparatus that exposes a resist R applied on a wafer W, and includes a light source 10, a photomask 20, and a lens 30. The light source 10 outputs light L having a wavelength to which the resist R is sensitive. The photomask 20 has a reticle pattern (exposure pattern) for forming an imaging element 40 (see FIG. 3) described below. The photomask 20 is disposed to face the light source 10. The photomask 20 has one or a plurality of reticle patterns 21. The lens 30 is disposed between the photomask 20 and the wafer W. The light L output from the light source 10 passes through the photomask 20, is then condensed by the lens 30, and reaches the resist R on the wafer W. The resist R may be any of a positive type and a negative type.

Figure 2:
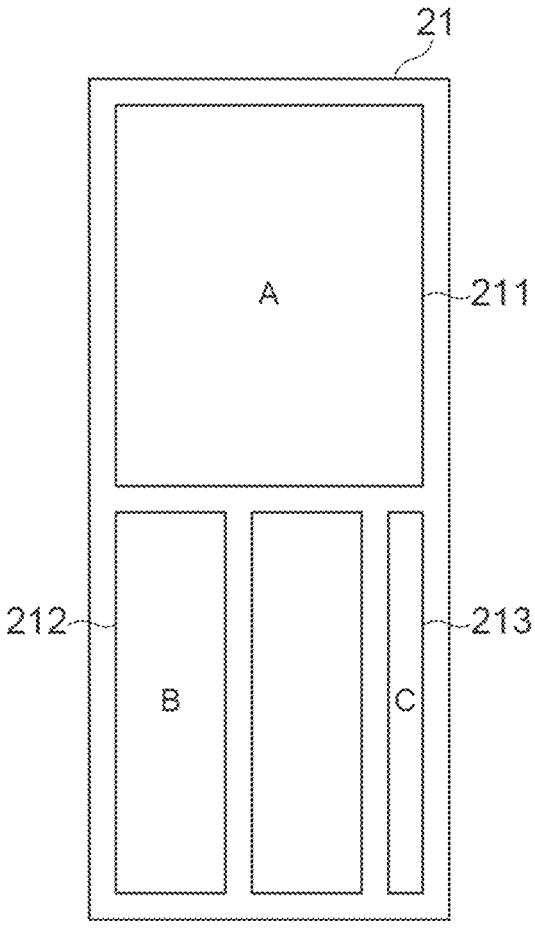
FIG. 2 is a plan view schematically illustrating a reticle pattern of a photomask.

FIG. 2 is a plan view schematically illustrating one of the reticle patterns 21 of the photomask 20. The reticle pattern 21 includes at least a first portion 211, a second portion 212, and a third portion 213. The first portion 211 is indicated by a reference sign "A". The second portion 212 is indicated by a reference sign "B". The third portion 213 is indicated by a reference sign "C". The first portion 211 is a portion for forming a light receiving portion of the imaging element 40. When the light receiving portion of the imaging element 40 is divided into a plurality of circuit regions, the first portion 211 includes an exposure pattern corresponding to a circuit pattern common to a plurality of circuit regions. The second portion 212 is a portion for forming a circuit region 42 (see FIG. 3) parallel to one end of the light receiving portion in the imaging element 40. The third portion 213 is a portion for forming a circuit region 43 (see FIG. 3) parallel to the other end of the light receiving portion in the imaging element 40. The second portion 212 and the third portion 213 include an exposure pattern corresponding to a circuit that supplies a bias power supply to the light receiving portion, or the like.

Part (a) of FIG. 3 is a plan view illustrating a circuit forming surface of the wafer W after exposure and development. Part (b) of FIG. 3 is a diagram illustrating a part of Part (a) of FIG. 3 on an enlarged scale. As illustrated in Part (a) of FIG. 3, a plurality of imaging elements 40 are formed on the wafer W by exposure with the exposure apparatus 1 and subsequent development. The plurality of imaging elements 40 are arranged along a direction D2 intersecting the direction D1 with the direction D1 as the longitudinal direction. As illustrated in Part (b) of FIG. 3, each of the plurality of imaging elements 40 has a circuit region group 44 including a plurality of circuit regions 41 arranged along the direction D1, the circuit region 42 disposed at one end of the circuit region group 44 in the direction D1, and the circuit region 43 disposed at the other end of the circuit region group 44 in the direction D1. The circuit region group 44 includes the light receiving portion.

Each of the plurality of circuit regions 41 is a region formed by stitch exposure using the first portion 211 illustrated in FIG. 2. That is, the plurality of circuit regions 41 are regions formed by exposing the resist R while moving the first portion 211 along the direction D1. In this case, adjacent regions exposed by the first portion 211 may overlap each other in a part thereof. The plurality of circuit regions 41 have the same circuit pattern. The circuit region 42 is a region formed by exposure using the second portion 212 illustrated in FIG. 2. The circuit region 43 is a region formed by exposure using the third portion 213 illustrated in FIG. 2. The circuit region 42 has a circuit pattern different from the circuit regions 41. The circuit region 43 has a circuit pattern different from the circuit regions 41 and 42.

Part (c) of FIG. 3 is a diagram illustrating a cross section taken along line IIIc-IIIc of Part (b) of FIG. 3. As illustrated in Part (c) of FIG. 3, the circuit region group 44, the circuit region 42, and the circuit region 43 are provided on a single substrate 62 cut out from the wafer W. A length of the substrate 62 in the direction D1 is equal to or greater than 20 mm and equal to or less than 300 mm, for example.

FIG. 4 is a diagram illustrating a specific configuration example of each of a plurality of imaging elements 40. As illustrated in FIG. 4, the circuit region group 44 has a pixel array 45, an amplifier array 46, an analog/digital (A/D) converter array 47, a memory array 48, a horizontal scanning circuit group 49, an output circuit group 50, a clock transmission circuit 80A for A/D converter and a clock transmission circuit 80B for horizontal scanning circuit and output circuit. The pixel array 45 is configured in such a manner that a plurality of regions 451 included in the plurality of respective circuit regions 41 are disposed in parallel along the direction D1. The amplifier array 46 is configured in such a manner that a plurality of regions 461 included in the plurality of respective circuit regions 41 are disposed in parallel along the direction D1. The A/D converter array 47 is configured in such a manner that a plurality of regions 471 included in the plurality of respective circuit regions 41 are disposed in parallel along the direction D1. The memory array 48 is configured in such a manner that a plurality of regions 481 included in the plurality of respective circuit regions 41 are disposed in parallel along the direction D1. The horizontal scanning circuit group 49 is configured in such a manner that a plurality of regions 491 included in the plurality of respective circuit regions 41 are disposed in parallel along the direction D1. The output circuit group 50 is configured in such a manner that a plurality of regions 501 included in the plurality of respective circuit regions 41 are disposed in parallel along the direction D1. In FIG. 4, only some circuit regions 41 positioned near both ends of the circuit region group 44 in the direction D1 among the plurality of circuit regions 41 are illustrated, and other circuit regions 41 are not illustrated.

The pixel array 45 includes a plurality of pixels arranged in a one-dimensional or two-dimensional manner. The plurality of pixels are arranged along at least the direction D1. Each of the plurality of regions 451 includes two or more pixels. Accordingly, for example, when each of P regions 451 includes Q pixels, the number of pixels in the entire pixel array 45 is (P×Q). P and Q are an integer equal to or greater than two. The Q pixels take an arrangement of n columns×m rows (n×m=Q, and n and m are a natural number). Each pixel generates an electric charge with an amount according to the intensity of light incident on each pixel. Each pixel may include an intra-pixel amplifier for current-voltage conversion in the pixel. Each pixel can be formed by, for example, ion implantation into the surface of the wafer W. Wirings connected to each pixel can be formed by, for example, etching on the surface of the wafer W. The plurality of regions 451 have the same circuit pattern. An exposure pattern in ion implantation and etching is common to the plurality of regions 451.

The amplifier array 46 may include a plurality of amplifiers. Each of the plurality of amplifiers performs current-voltage conversion on each of a plurality of analog signals output from the plurality of respective pixels of the pixel array 45. Alternatively, when each pixel performs current-voltage conversion on an analog signal, each of the plurality of amplifiers multiplies each of the plurality of analog signals subjected to current-voltage conversion. The plurality of amplifiers correspond to a plurality of pixel columns of the pixel array 45. Each of the plurality of regions 461 includes two or more amplifiers. For example, when each of the P regions 451 includes n pixel columns, each of P regions 461 includes n amplifiers. Accordingly, the number of amplifiers of the entire amplifier array 46 is at least (P×n). Each of the plurality of amplifiers can be configured with, for example, an amplification circuit including a transistor.

A drain region and a source region of the transistor can be formed by, for example, ion implantation into the surface of the wafer W. A wiring connected to each of a gate, the drain region, and the source region of the transistor can be formed by, for example, a lift-off method on the surface of the wafer W. The plurality of regions 461 have the same circuit pattern. An exposure pattern in ion implantation and lift-off is common to the plurality of regions 461.

The A/D converter array 47 includes a plurality of A/D converters. Each of the plurality of A/D converters converts each of the plurality of analog signals output from the plurality of respective pixels of the pixel array 45 into a digital signal. The plurality of A/D converters correspond to the plurality of amplifiers of the amplifier array 46. Each of the plurality of regions 471 includes two or more A/D converters. For example, when each of the P regions 461 includes n amplifiers, each of P regions 471 includes n A/D converters. Accordingly, the number of A/D converters of the entire A/D converter array 47 is at least (P×n). The plurality of regions 471 have the same circuit pattern. An exposure pattern in forming an A/D converter is common to the plurality of regions 471.

The memory array 48 has a plurality of memory cells (storage regions). Each of the plurality of memory cells stores each of a plurality of digital signals output from the A/D converter array 47. The plurality of memory cells correspond to the plurality of A/D converters. Each of the plurality of regions 481 includes two or more memory cells. For example, when each of the P regions 471 includes n A/D converters, each of P regions 481 includes n memory cells. Accordingly, the number of memory cells in the entire memory array 48 is (P×n). The plurality of regions 481 have the same circuit pattern. An exposure pattern in forming a memory cell is common to the plurality of regions 481.

The horizontal scanning circuit group 49 outputs the plurality of digital signals stored in the memory array 48 in order as a serial signal. The horizontal scanning circuit group 49 has the plurality of regions 491. Each of the plurality of regions 491 includes two or more horizontal scanning circuits. In an example, the number of horizontal scanning circuits included in each of the plurality of regions 491 is two. In this case, for example, if each of the P regions 481 includes n memory cells, (n/2) memory cells correspond to one horizontal scanning circuit. The plurality of regions 491 have the same circuit pattern. An exposure pattern in forming a horizontal scanning circuit is common to the plurality of regions 491.

The output circuit group 50 has the plurality of regions 501. Each of the plurality of regions 501 is connected to each of the plurality of regions 491 of the horizontal scanning circuit group 49. Each horizontal scanning circuit sequentially outputs the digital signals from the (n/2) memory cells as a serial signal to the region 501 corresponding to each horizontal scanning circuit. Each region 501 includes an output circuit corresponding to the horizontal scanning circuit included in each region 491 of the horizontal scanning circuit group 49. Each output circuit receives the digital signals sequentially output as the serial signal from the corresponding horizontal scanning circuit. The output circuit of each region 501 generates output data Dout from the digital signals and outputs the output data Dout to the outside of the imaging element 40.

The circuit region 42 includes, for example, a timing control circuit 421. The timing control circuit 421 transmits a common clock signal to the pixel array 45, the amplifier array 46, the clock transmission circuit 80A for A/D converter, and the clock transmission circuit 80B for horizontal scanning circuit.

The circuit region 43 includes, for example, a bias voltage generation circuit 431. The bias voltage generation circuit 431 is connected to each of the plurality of pixels of the pixel array 45, each of the plurality of amplifiers of the amplifier array 46, and each of the plurality of A/D converters of the A/D converter array 47 via wirings (not illustrated). The bias voltage generation circuit 431 supplies a bias voltage to the plurality of pixels of the pixel array 45, the plurality of amplifiers of the amplifier array 46, and the plurality of A/D converters of the A/D converter array 47.

Subsequently, the configuration of the clock transmission circuits 80A and 80B will be described in detail. The clock transmission circuits 80A and 80B include a clock tree provided on the single substrate 62 (see Part (c) of FIG. 3). FIG. 5 is a diagram schematically illustrating a configuration of a clock tree 70 as an example. The clock tree 70 has a plurality of stages of branches between a wiring 76 to which the clock signal is input and a circuit 77 that uses a clock. Each branch branches off one clock wiring into at least two wirings. In FIG. 5, as an example, three stages of branches in total including an initial stage C1, a second stage C2, and a third stage (final stage) C3 are illustrated. Each of wirings between the initial stage C1 and the second stage C2, wirings between the second stage C2 and the third stage C3, and wirings between the third stage C3 and the circuit 77 is provided with one or a plurality of repeater buffers 78.

FIG. 6 is a circuit diagram illustrating a configuration of a clock transmission circuit 80. The clock transmission circuits 80A and 80B illustrated in FIG. 4 have the same configuration as the clock transmission circuit 80. When the circuit 77 of FIG. 6 is the A/D converter array 47, the circuit 77 includes all A/D converters included in the plurality of regions 471. When the circuit 77 is the horizontal scanning circuit group 49, the circuit 77 includes all horizontal scanning circuits included in the plurality of regions 491. When the circuit 77 is the output circuit group 50, the circuit 77 includes all output circuits included in the plurality of regions 501.

The clock transmission circuit 80 includes a plurality of circuit regions 81. Each of the plurality of circuit regions 81 is included in each of the plurality of circuit regions 41 (see FIGS. 3 and 4). Each of the plurality of circuit regions 81 have common circuit patterns and are arranged along the direction D1. Each circuit region 81 is in contact with and continuous to an adjacent circuit region 81.

FIG. 7 is a circuit diagram illustrating a circuit pattern of each circuit region 81. As illustrated in FIG. 7, the circuit pattern of the circuit region 81 has at least two (in the present embodiment, nine) circuit elements E0 to E8 and wirings W1 to W6. At least the circuit elements E0 to E6 (in the present embodiment, all circuit elements E0 to E8) among the circuit elements E0 to E8 are circuit elements that are switchable between a high impedance state and a pass state, for example, TRI-STATE (Registered Trademark) type circuit elements. The TRI-STATE type is also referred to as a three-state type. The high impedance state refers to an insulation state or a state in which a resistance value is close to the insulation state. The pass state refers to a state in which a signal following a logic of an input signal is output. In an example, the circuit elements E0 to E8 are TRI-STATE buffers or TRI-STATE inverters. The circuit elements E0 to E8 function as repeater buffers in the clock tree. The wirings W1 to W6 are wirings that are connected to the circuit patterns of adjacent circuit regions 81. The circuit pattern of each circuit region 81 includes a plurality of stages of circuit portions. That is, the circuit pattern of each circuit region 81 includes a clock supply portion 82, a first stage (initial stage) circuit portion 83, a second stage circuit portion 84, and a third stage (final stage) circuit portion 85.

The clock supply portion 82 is a portion that supplies the clock signal input from the outside of the clock transmission circuit 80 to the clock tree. The clock supply portion 82 includes the circuit elements E0 and E1 and the wirings W5 and W6. One end of the wiring W5 is connected to the wiring W6 of the circuit region 81 adjacent to one side (the left side of the drawing) of the circuit region 81. The other end of the wiring W5 is connected to an input end of the circuit element E0. The input end of the circuit element E0 receives the clock signal input from the outside of the clock transmission circuit 80 via the adjacent circuit region 81. One end of the wiring W6 is connected to an output end of the circuit element E0. The other end of the wiring W6 is connected to the wiring W5 of the circuit region 81 adjacent to the other side (the right side of the drawing) of the circuit region 81. An input end of the circuit element E1 is connected to the wiring W6.

When the circuit element E0 is in the pass state, the clock signal propagates from the wiring W5 to the wiring W6. When the circuit element E0 is in the high impedance state, the clock signal does not propagate from the wiring W5 to the wiring W6. Both the circuit elements E0 and E1 are in the pass state, the clock signal propagates from the wiring W5 to the first stage circuit portion 83. When the circuit element E0 is in the pass state and the circuit element E1 is in the high impedance state, the clock signal propagates through the wirings W5 and W6, but does not propagate to the first stage circuit portion 83.

The first stage circuit portion 83 is a portion that branches the clock signal supplied from the clock supply portion 82. The circuit portion 83 includes the circuit element E2 (third circuit element), the circuit element E3 (fourth circuit element), and the circuit element E4 (fifth circuit element). In addition, the circuit portion 83 includes the wiring W3 (third wiring portion) and the wiring W4 (fourth wiring portion).

An output end of the circuit element E2, an input end of the circuit element E3, and an input end of the circuit element E4 are connected to a node N2 (second node). An input end of the circuit element E2 and an output end of the circuit element E3 are connected to a node N3 (third node). In other words, the circuit elements E2 and E3 are in opposite directions and connected in parallel between the node N2 and the node N3. An input end of the circuit element E4 is connected to one end of the parallel circuit. The wiring W3 is a wiring portion for connecting the node N2, to the node N3 of the circuit region 81 adjacent to one side (the left side of the drawing) of the circuit region 81. The wiring W4 is a wiring portion for connecting the node N3, to the node N2 of the circuit region 81 adjacent to the other side (the right side of the drawing) of the circuit region 81. The node N3 is connected to a clock supply wiring from the outside of the clock transmission circuit 80, that is, an output end of the circuit element E1 of the clock supply portion 82.

When the circuit element E2 is in the pass state and the circuit element E3 is in the high impedance state, the clock signal propagates from the node N3 to the node N2. Conversely, when the circuit element E2 is in the high impedance state and the circuit element E3 is in the pass state, the clock signal propagates from the node N2 to the node N3. The circuit elements E2 and E3 are not brought into the pass state simultaneously. When both the circuit elements E2 and E3 are in the high impedance state, the clock signal does not propagate between the node N2 and the node N3. When the circuit element E4 is in the pass state, the clock signal propagates from the node N2 to the second stage circuit portion 84. When the circuit element E4 is in the high impedance state, the clock signal does not propagate from the node N2 to the second stage circuit portion 84.

When the clock signal propagates through the circuit portion 83, the circuit portion 83 can receive the clock signal at the node N3 and can output the clock signal from an output end of the circuit element E4 as necessary. A propagation direction of the clock signal can be controlled by controlling the states of the circuit elements E2 and E3. While the clock tree includes branches over a plurality of circuit regions 81 and branches inside each circuit region 81, the circuit portion 83 carries an initial stage branch among the branches over the plurality of circuit regions 81.

The second stage circuit portion 84 is a portion that further branches the clock signal supplied from the first stage circuit portion 83. The circuit portion 84 includes the circuit element E5 (first circuit element) and the circuit element E6 (second circuit element). In addition, the circuit portion 84 includes the wiring W1 (first wiring portion) and the wiring W2 (second wiring portion).

Output ends of the circuit elements E5 and E6 are connected. In other words, the output ends of the circuit elements E5 and E6 are connected to a node N1. The wiring W1 is a wiring portion for connecting an input end of the circuit element E5 to an input end of the circuit element E6 of the circuit region 81 adjacent to one side (the left side of the drawing) of the circuit region 81. The wiring W1 is connected to the wiring W2 of the circuit region 81 adjacent to one side of the circuit region 81. In addition, the wiring W1 is connected to the output end of the circuit element E4. The wiring W2 is a wiring portion for connecting the input end of the circuit element E6, to the input end of the circuit element E5 of the circuit region 81 adjacent to the other side (the right side of the drawing) of the circuit region 81. The wiring W2 is connected to the wiring W1 of the circuit region 81 adjacent to the other side of the circuit region 81.

When the circuit element E5 is in the pass state and the circuit element E6 is in the high impedance state, the clock signal propagates from the wiring W1 to the node N1. When the circuit element E5 is in the high impedance state and the circuit element E6 is in the pass state, the clock signal propagates from the wiring W2 to the node N1. The circuit elements E5 and E6 are not brought into the pass state simultaneously. When both the circuit elements E5 and E6 are in the high impedance state, the clock signal does not propagate to the node N1.

When the clock signal propagates through the circuit portion 84, the circuit portion 84 can receive the clock signal in the wiring W1 or the wiring W2 and can output the clock signal from the node N1. While the clock tree includes the branches over the plurality of circuit regions 81 and the branches inside each circuit region 81 as described above, the circuit portion 84 carries a last stage branch among the branches over the plurality of circuit regions 81.

The third stage circuit portion 85 is a portion that carries the branches inside each circuit region 81. The circuit portion 85 includes the circuit element E7 and the circuit element E8. Input ends of the circuit element E7 and the circuit element E8 are connected to the node N1 and are connected. Output ends of the circuit element E7 and the circuit element E8 branch off into a plurality of wirings 87 as illustrated in FIG. 6, and then, are connected to a plurality of clock supply targets included in the circuit 77 that uses a clock, respectively. The plurality of clock supply targets included in the circuit 77 that uses a clock are, for example, the plurality of A/D converters of the A/D converter array 47, a plurality of horizontal scanning circuits of the horizontal scanning circuit group 49, or a plurality of output circuits of the output circuit group 50. The output terminals of the circuit element E7 and the circuit element E8 are connected to a wiring provided in common over the plurality of circuit regions 81, and may be connected to the plurality of clock supply targets of the circuit 77 via the wiring.

To express the above-described configuration in other words, in the clock supply portion 82, as illustrated in FIG. 6, the circuit elements E0 of the plurality of circuit regions 81 are connected in series in a state of being aligned in direction. Then, the input end of the circuit element E1 of each circuit region 81 is connected to a node between adjacent circuit elements E0. In the first stage circuit portion 83, the circuit elements E2 of the plurality of circuit regions 81 are connected in series in a state of being aligned in direction, and the circuit elements E3 of the plurality of circuit regions 81 are connected in series in a state of being aligned in direction in a direction opposite to the circuit elements E2. A node between adjacent circuit elements E2 is common to a node between adjacent circuit elements E3. The node between the circuit elements E2 is alternately connected to the output end of the circuit element E1 and the input end of the circuit element E4. In the second stage circuit portion 84, while the circuit element E6 is in a direction opposite to the circuit element E5, the circuit elements E5 and E6 are alternately connected in series. The output end of the circuit element E4 is connected to a node between the input end of the circuit element E5 and the input end of the circuit element E6.

A clock propagation path F1 illustrated in FIG. 6 illustrates an example of a clock tree that can be implemented by the plurality of circuit regions 81 having the above-described configuration. The circuit elements (in the drawing, illustrated in white) on the path of the clock propagation path F1 are brought into the pass state, and the circuit elements (in the drawing, illustrated in halftone) out of the path of the clock propagation path F1 are brought into the high impedance state. Hereinafter, specific description will be provided.

First, in the clock supply portion 82, the circuit elements E0 of two circuit regions 81A and 81B on one side among four circuit elements 81 illustrated in FIG. 6 are brought into the pass state, and the circuit elements E0 of two circuit regions 81C and 81D on an opposite side are brought into the high impedance state. The circuit element E1 of the circuit region 81B is brought into the pass state, and the circuit elements E1 of other circuit regions 81A, 81C, and 81D are brought into the high impedance state. With this, the clock signal supplied from the outside of the clock transmission circuit 80 passes through the circuit elements E0 of the circuit regions 81A and 81B and the circuit element E1 of the circuit region 81B, and reaches a vertex (clock input end) of the clock tree positioned in the circuit region 81B.

Next, in the first stage circuit portion 83, the circuit element E2 of the circuit region 81B is brought into the pass state, and the circuit elements E2 of other circuit regions 81A, 81C, and 81D are brought into the high impedance state. The circuit element E3 of the circuit region 81C is brought into the pass state, and the circuit elements E3 of other circuit regions 81A, 81B, and 81D are brought into the high impedance state. In addition, the circuit elements E4 of the circuit regions 81B and 81D are brought into the pass state, and the circuit elements E4 of other circuit regions 81A and 81C are brought into the high impedance state.

With this, the clock signal is branched off into a clock signal that passes through the circuit elements E2 and E4 of the circuit region 81B and a clock signal that passes through the circuit element E3 of the circuit region 81C and the circuit element E4 of the circuit region 81D.

Subsequently, in the second stage circuit portion 84, the circuit elements E5 of the circuit regions 81B and 81D are brought into the pass state, and the circuit elements E5 of other circuit regions 81A and 81C are brought into the high impedance state. The circuit elements E6 of the circuit regions 81A and 81C are brought into an electric conduction state, and the circuit elements E6 of other circuit regions 81B and 81D are brought into the high impedance state. The clock signal that passes through the circuit element E4 of the circuit region 81B is accordingly branched off into a clock signal that passes through the circuit element E6 of the circuit region 81A and a clock signal that passes through the circuit element E5 of the circuit region 81B. The clock signal that passes through the circuit element E4 of the circuit region 81D is accordingly branched off into a clock signal that passes through the circuit element E6 of the circuit region 81C and a clock signal that passes through the circuit element E5 of the circuit region 81D.

Subsequently, in the third stage circuit portion 85 of each of the circuit regions 81A to 81D, the clock signal that passes through the circuit element E5 or E6 is branched off into a clock signal that passes through the circuit element E7 and a clock signal that passes through the circuit element E8. The eight branched clock signals in total pass through the wirings 87 and are supplied to the circuit 77 that uses a clock.

In the present embodiment, although a case where the circuit portion 83 has only one stage has been described, as illustrated in FIG. 8, the circuit portion 83 may be provided over a plurality of stages. In other words, the circuit portion 83 may further carry middle stage branches in addition to the initial stage branch among the branches over the plurality of circuit regions 81. In this case, the node N3 of each circuit portion 83 after the second stage is connected to the output end of the circuit element E4 of the circuit portion 83 in a pre-stage of the circuit portion 83. With this, the number of middle stage branches among the branches over the plurality of circuit regions 81 of the clock tree can be increased to any number.

In the above-described example, all of the A/D converter array 47, the horizontal scanning circuit group 49, and the output circuit group 50 receive the supply of the clock signal via the clock transmission circuit 80. Only one or two of the A/D converter array 47, the horizontal scanning circuit group 49, and the output circuit group 50 may receive the supply of the clock signal via the clock transmission circuit 80.

Here, circuits that control the circuit elements E0 to E8 of each circuit region 81 will be described. FIG. 9 is a circuit diagram illustrating circuits that control the circuit elements E0 and E1 of each circuit region 81. Because control circuits of other circuit elements E2 to E8 also have the same configuration as the above-described circuits, the control circuits are not shown.

Each circuit region 81 further has a plurality of flip-flops 88 corresponding to each of the circuit elements E0 to E8. The flip-flops 88 corresponding to the circuit elements E0 are connected in a cascade manner over the plurality of circuit regions 81. The flip-flops 88 corresponding to the circuit elements E1 are also connected in a cascade manner over the plurality of circuit regions 81. The flip-flops 88 corresponding to each of the circuit elements E2 to E8 are also similarly connected in a cascade manner over the plurality of circuit regions 81.

A binary signal $S_{E0}$ is input to one end of the above-described cascade connection circuit corresponding to the circuit elements E0. The binary signal $S_{E0}$ is a signal that takes an on value or an off value in synchronization with a clock CLK supplied to the cascade connection circuit. In the example illustrated in the drawing, four periods of the clock are illustrated in the clock CLK. An output value of the flip-flop 88 of the circuit region 81D positioned at a rearmost end of the cascade connection circuit is controlled according to a value of the binary signal $S_{E0}$ in an initial period, and the circuit element E0 of the circuit region 81D is controlled. An output value of the flip-flop 88 of the circuit region 81C is controlled according to a value of the binary signal $S_{E0}$ in a second period, and the circuit element E0 of the circuit region 81C is controlled. An output value of the flip-flop 88 of the circuit region 81B is controlled according to a value of the binary signal $S_{E0}$ in a third period, and the circuit element E0 of the circuit region 81B is controlled. Then, an output value of the flip-flop 88 of the circuit region 81A is controlled according to a value of the binary signal $S_{E0}$ in a fourth period, and the circuit element E0 of the circuit region 81A is controlled. In this way, the value of the binary signal $S_{E0}$ is set to any value for each period of the clock CLK, so that the circuit elements E0 of the plurality of circuit regions 81 can be controlled individually. The circuit elements E1 of the plurality of circuit regions 81 can be controlled individually by setting the value of the binary signal $S_{E1}$ to any value for each period of the clock CLK. The same applies to other circuit elements E2 to E8.

FIG. 10 is a diagram illustrating another control example of the clock transmission circuit 80. In this example, control states of the circuit elements E0 and E1 of the clock supply portion 82 (see FIG. 7) are the same as in the example illustrated in FIG. 6. Then, in the circuit regions 81A, 81C, and 81D, all circuit elements E2 to E8 included in the first stage circuit portion 83, the second stage circuit portion 84, and the third stage circuit portion 85 are brought into the high impedance state. Then, only in the circuit region 81B, the circuit elements E2 to E8 are controlled similarly to the control states illustrated in FIG. 6. In this way, a clock tree may be configured with only some circuit regions 81 among the plurality of circuit regions 81. When some clock supply targets among the plurality of clock supply targets included in the circuit 77 that uses a clock are used, and the other clock supply targets are not used, a clock tree may be configured with only some circuit regions 81 in this way. With this, power consumption can be reduced.

FIG. 11 is a flowchart illustrating a method for manufacturing the clock transmission circuit 80 according to the present embodiment. In manufacturing the clock transmission circuit 80, first, a common exposure pattern for the circuit regions 81 is formed in the first portion 211 of the reticle pattern 21 illustrated in FIG. 2, for example, and stitch exposure is performed on the resist R (see FIG. 1) using the exposure pattern (Step S1). Next, the resist R is developed and cured to form a mask (Step S2). Then, ion implantation, semiconductor etching, or metal lift-off is performed via the mask, and the constituent elements of the circuit elements E0 to E8 or the wirings W1 to W6 are produced (Step S3). Steps S1 to S3 described above are repeated by the number of times required for producing the clock transmission circuit 80 (Step S4). Thereafter, the wafer is cut and singulated (Step S5). With the above-described steps, the clock transmission circuit 80 including the plurality of circuit regions 81 that have the common circuit patterns and are arranged along the direction D1 can be produced on a single substrate.

Effects that are obtained by the clock transmission circuit 80, the imaging element 40, and the method for manufacturing the clock transmission circuit 80 of the present embodiment described above will be described. FIG. 12 is a diagram schematically illustrating a clock transmission circuit 100 as a reference example. In the clock transmission circuit 100, each of a plurality of circuit regions 110 arranged along a direction D1 has repeater buffers 101 to 104. The repeater buffers 101 and 102 are alternately connected in series over the plurality of circuit regions 110. Input ends of the repeater buffers 103 and 104 are connected to a node between the repeater buffer 101 and the repeater buffer 102. A clock signal is input from one end of a series circuit of the repeater buffers 101 and 102 and is branched to the repeater buffers 103 and 104 in each circuit region 110 while propagating through the series circuit.

In such a clock transmission circuit 100, as a propagation length of the clock circuit is longer is longer in the series circuit of the repeater buffers 101 and 102, the clock signal is more delayed. Accordingly, the clock signal is more delayed in the circuit region 110 farther from one end of the series circuit to which the clock signal is input. FIG. 13 is a diagram illustrating an influence of delay of the clock signal. Part (a) of FIG. 13 illustrates a clock signal input to one end of the series circuit. Part (b) of FIG. 13 illustrates an example of a serial signal that is output from circuits to be driven by a clock signal output from the circuit region 110 close to one end of the series circuit. Part (c) of FIG. 13 illustrates an example of a serial signal that is output from circuits to be driven by a clock signal output from the circuit region 110 far from one end of the series circuit. If delay occurs in some circuit regions 110, delay T occurs between the serial signals. Accordingly, there is a concern that signal recognition accuracy is reduced in a circuit that reads the serial signal.

Accordingly, a clock tree is used to input the clock signal to many circuits at the same timing. Note that, when stitch exposure is performed in a photolithography process in manufacturing a large-area semiconductor element, a plurality of circuit regions having the same circuit pattern are arranged. While a clock tree is easily formed in each circuit region, a clock tree that crosses a plurality of circuit regions is difficult to be formed. A clock tree can be formed by making a circuit pattern different for each circuit region. However, in this case, because many kinds of exposure patterns need to be prepared, manufacturing costs are increased and a manufacturing process is complicated.

In the present embodiment, the circuit pattern of each of the plurality of circuit regions 81 has the circuit elements E0 to E6 that are switchable between the high impedance state and the pass state, and the wirings W1 to W6 that are connected to the circuit patterns of the circuit regions 81 adjacent to the circuit pattern. Then, the states of the circuit elements E0 to E6 of the plurality of circuit regions 81 are controlled to be predetermined states determined for each circuit region 81 as illustrated in FIG. 6, so that the clock tree crossing the plurality of circuit regions 81 is configured. With this, the clock tree that crosses the plurality of circuit regions 81 having the same circuit pattern can be formed. Accordingly, the delay of the clock signal among the plurality of circuit regions 81 can be reduced. In addition, because the circuit pattern does not need to be made different for each circuit region, many types of exposure patterns do not need to be prepared. Therefore, the manufacturing cost can be reduced and the manufacturing process can be simplified.

As in the present embodiment, the circuit pattern of each circuit region 81 may include a plurality of stages of circuit portions 83 and 84 configured to take on a plurality of stages of branches of the clock tree, respectively. In this case, the branches of the respective stages of the clock tree can be suitably implemented by the circuit portions 83 and 84 of the respective stages.

As in the present embodiment, the circuit portion 84 may include the circuit elements E5 and E6 the output ends of which are connected. Then, the wirings W1 to W6 may include a wiring W1 that connects the input end of the circuit element E5, to the input end of the circuit element E6 of the circuit region 81 adjacent to one side of concerned circuit region 81, and a wiring W2 that connects the input end of the circuit element E6, to the input end of the circuit element E5 of the circuit region 81 adjacent to the other side of the concerned circuit region 81. The circuit portion 84 through which the clock signal propagates can receive the clock signal from the wiring W1 (or may be the wiring W2) and can output the clock signal from the node N1 between the output end of the output circuit element E5 and the output end of the circuit element E6. Therefore, the circuit portion 84 that carries the branches of one stage can be simply implemented.

As in the present embodiment, the circuit portion 83 may include the circuit elements E2, E3, and E4. Then, the output end of the circuit element E2, the input end of the circuit element E3, and the input end of the circuit element E4 may be connected to the node N2, and the input end of the circuit element E2 and the output end of the circuit element E3 may be connected to the node N3. Then, the wirings W1 to W6 may include a wiring W3 that connects the node N2 to the node N3 of the circuit region 81 adjacent to one side of concerned circuit region 81, and a wiring W4 that connects the node N3 to the node N2 of the circuit region 81 adjacent to the other side of the concerned circuit region 81. The circuit portion 83 through which the clock signal propagates can receive the clock signal at the node N3 (or may be the node N2) and can output the clock signal from the output end of the circuit element E4 as necessary. In addition, a propagation direction of the clock signal can be controlled by controlling the states of the circuit elements E2 and E3. Therefore, the circuit portion 83 that carries the branches of the first stage or the middle stage can be simply implemented.

As in the present embodiment, the circuit elements E0 to E6 may be a TRI-STATE type. In this case, each of the circuit elements E0 to E6 can be simply configured with a single functional portion. Because an output resistance value in the pass state of the circuit elements E0 to E6 can be reduced to be low, the delay of the clock signal due to the resistance values of the circuit elements E0 to E6 can be reduced.

In the imaging element 40 of the present embodiment, at least one of the A/D converter array 47, the horizontal scanning circuit group 49, and the output circuit group 50 receives supply of a clock signal via a clock transmission circuit having the same configuration as the clock transmission circuit 80. With the imaging element 40, the delay of the clock signal among a plurality of digital signals can be reduced. Therefore, a frequency of errors in reading a serial signal can be reduced.

The clock transmission circuit, the imaging element, and the method for manufacturing a clock transmission circuit according to the present disclosure are not limited to the above-described embodiment, and various other modifications can be made. For example, although an example where each circuit region 81 has nine circuit elements E0 to E8 has been described in the above-described embodiment, a clock tree that crosses two circuit regions 81 can be implemented as long as each circuit region 81 has at least the circuit portion 84. In other words, each circuit region 81 may have at least two circuit elements E5 and E6.

Although a case where the circuit elements E0 to E6 are the TRI-STATE type has been illustrated in the above-described embodiment, the circuit elements E0 to E6 are not limited to the TRI-STATE type as long as the circuit elements are switchable between the high impedance state and the pass state. For example, the circuit elements E0 to E6 may include repeater buffers and switches connected in series. Also in this case, the high impedance state and the pass state of the circuit elements E0 to E6 can be switched by controlling the switches.

The circuit elements E7 and E8 that configure the final stage circuit portion 85 desirably have a configuration for avoiding a situation in which a potential of the clock signal that is supplied to the circuit 77 is unstable. Parts (a), (b), and (c) of FIG. 14 are circuit diagrams illustrating a configuration example of such a circuit element.

The circuit element illustrated in Parts (a) and (b) of FIG. 14 include logic circuits. Specifically, the circuit element illustrated in Part (a) of FIG. 14 includes a logical product (AND) element 91. In an example, the circuit element has only the AND element 91. A clock signal Sclk from the pre-stage circuit portion 84 is input to one input end between two input ends of the AND element 91. A control signal Sctrl from the flip-flop 88 (see FIG. 9) connected in a cascade manner is input to the other input end between the two input ends of the AND element 91. The AND element 91 outputs a logical product of the clock signal Sclk and the control signal Sctrl to the circuit 77. The circuit element illustrated in Part (b) of FIG. 14 includes a logical sum (OR) element 92 and a negation (NOT) element 93. In an example, the circuit element has only the OR element 92 and the NOT element 93. The clock signal Sclk from the pre-stage circuit portion 84 is input to one input end between two input ends of the OR element 92. The other input end between the two input ends of the OR element 92 is connected to an output end of the NOT element 93. The control signal Sctrl from the flip-flop 88 (see FIG. 9) connected in a cascade manner is input to the other input end via the NOT element 93. The OR element 92 outputs a logical sum of the clock signal Sclk and a signal obtained by logically inverting the control signal Sctrl to the circuit 77.

The circuit element illustrated in Part (c) of FIG. 14 includes a TRI-STATE type circuit element 94 and a pull-up resistor 95. In an example, the circuit element has only the TRI-STATE circuit element 94 and the pull-up resistor 95. The pull-up resistor 95 is connected between an output end of the circuit element 94 and a power supply voltage Vdd. The circuit element may have a pull-down resistor connected between the output end of the circuit element 94 and a reference potential (ground potential), instead of the pull-up resistor 95 or along with the pull-up resistor 95. With any configuration illustrated in Parts (a), (b), and (c) of FIG. 14, the level of the clock signal to the circuit 77 becoming unstable can be suppressed, thereby preventing an erroneous operation of the circuit 77.

Although an example where the clock transmission circuit 80 is applied to the imaging element has been described in the above-described embodiment, the clock transmission circuit 80 is not limited to the imaging element and can be applied to various semiconductor elements.

In the above-described embodiment, the clock tree is completed by the plurality of circuit regions 81 having the common circuit patterns. The clock tree may not necessarily be completed by only the plurality of circuit regions 81 having the common circuit patterns. For example, another circuit region that is disposed in parallel with the plurality of circuit regions 81 and has a circuit pattern different from the plurality of circuit regions 81 may configure a part of a clock tree.

Although the principle of the present invention has been illustrated and described in the preferred embodiment, those skilled in the art appreciate that disposition and details of the present invention can be changed without departing from such a principle. The present invention is not limited to a specific configuration disclosed in the present embodiment. Therefore, all corrections and alterations based on the claims and the scope of the spirit thereof are claimed.

REFERENCE SIGNS LIST

1 Exposure apparatus, 10 Light source, 20 Photomask, 21 Reticle pattern, 30 Lens, 40 Imaging element, 41 To 43 Circuit region, 44 Circuit region group, 45 Pixel array, 46 Amplifier array, 47 A/D converter array, 48 Memory array, 49 Horizontal scanning circuit group, 50 Output circuit group, 62 Substrate, 70 Clock tree, 76 Wiring, 77 Circuit that uses clock, 78 Repeater buffer, 80, 80A, 80B clock transmission circuit, 81, 81A to 81D circuit region, 82 Clock supply portion, 83 To 85 Circuit portion, 87 Wiring, 88 Flip-flop, 91 AND element, 92 OR element, 93 NOT element, 94 Circuit element, 95 Pull-up resistor, 100 Clock transmission circuit, 101 To 104 Repeater buffer, 110 Circuit region, 211 First portion, 212 Second portion, 213 Third portion, 421 Timing control circuit, 431 Bias voltage generation circuit, 451, 461, 471, 481, 491, 501 Region, C1 Initial stage, C2 Second stage, C3 Third stage (final stage), CLK clock, D1, D2 Direction, Dout output data, E0 To E8 Circuit element, F1 Clock propagation path, L light, N1 To N3 Node, R resist, $S_{E0}$, $S_{E1}$ Binary signal, Sclk clock signal, Sctrl control signal, W wafer, W1 To W6 Wiring.

The invention claimed is:

1. A clock transmission circuit including a clock tree provided on a single substrate, the clock transmission circuit comprising:

a plurality of circuit regions that have circuit patterns and are arranged in one direction, wherein each of the circuit patterns of the plurality of circuit regions has at least two circuit elements that are switchable between a high impedance state and a pass state, and wirings that are connected to the circuit patterns of circuit regions adjacent to concerned circuit region, among the plurality of circuit regions, wherein states of the at least two circuit elements of the plurality of circuit regions are controlled to be predetermined states determined for each circuit region, so that at least a part of the clock tree crossing the plurality of circuit regions is configured, wherein the circuit pattern includes a plurality of stages of circuit portions configured to take on a plurality of stages of branches of the clock tree, respectively, wherein one circuit portion among the plurality of stages of circuit portions includes first circuit element and second circuit element that are included in the at least two circuit elements and have output ends connected to each other, and wherein the wirings include a first wiring portion for connecting an input end of the first circuit element, to an input end of the second circuit element of a circuit region adjacent to one side of the concerned circuit region, among the plurality of circuit regions, and a second wiring portion for connecting an input end of the second circuit element, to an input end of the first circuit element of a circuit region adjacent to another side of the concerned circuit region, among the plurality of circuit regions.

2. A clock transmission circuit including a clock tree provided on a single substrate, the clock transmission circuit comprising:

a plurality of circuit regions that have circuit patterns and are arranged in one direction, wherein each of the circuit patterns of the plurality of circuit regions has at least two circuit elements that are switchable between a high impedance state and a pass state, and wirings that are connected to the circuit patterns of circuit regions adjacent to concerned circuit region, among the plurality of circuit regions, wherein states of the at least two circuit elements of the plurality of circuit regions are controlled to be predetermined states determined for each circuit region, so that at least a part of the clock tree crossing the plurality of circuit regions is configured, wherein the circuit pattern includes a plurality of stages of circuit portions configured to take on a plurality of stages of branches of the clock tree, respectively, wherein at least one circuit portion among the plurality of stages of circuit portions includes third circuit element, fourth circuit element, and fifth circuit element that are included in the at least two circuit elements, wherein an output end of the third circuit element, an input end of the fourth circuit element, and an input end of the fifth circuit element are connected to a second node, wherein an input end of the third circuit element and an output end of the fourth circuit element are connected to a third node, and wherein the wirings include a third wiring portion for connecting the second node, to the third node of a circuit region adjacent to one side of the concerned circuit region, among the plurality of circuit regions, and a fourth wiring portion for connecting the third node, to the second node of a circuit region adjacent to another side of the concerned circuit region, among the plurality of circuit regions.

3. The clock transmission circuit according to claim 1, wherein the at least two circuit elements are a TRI-STATE type.

4. The clock transmission circuit according to claim 1, wherein, among the at least two circuit elements, a circuit element that configures at least a final stage circuit portion is a TRI-STATE type, and an output end of the circuit element is connected to one or both of a pull-up resistor and a pull-down resistor.

5. The clock transmission circuit according to claim 1, wherein, among the at least two circuit elements, a circuit element that configures at least a final stage circuit portion includes a logic circuit.

6. An imaging element comprising:

a pixel array including a plurality of pixels arranged in a one-dimensional or two- dimensional manner;

an analog/digital converter array including a plurality of analog/digital converters configured to convert a plurality of analog signals output from the plurality of pixels into digital signals, respectively;

a memory array having a plurality of storage regions configured to store a plurality of digital signals output from the analog/digital converter array, respectively; and a horizontal scanning circuit configured to sequentially output the plurality of digital signals stored in the memory array, as a serial signal, wherein at least one of the analog/digital converter array and the horizontal scanning circuit receives supply of a clock signal via the clock transmission circuit according to claim 1.

7. A method for manufacturing a clock transmission circuit including a clock tree provided on a single substrate, the method comprising:

a step of performing stitch exposure to form a plurality of circuit regions that have circuit patterns and are arranged in one direction, wherein each of the circuit patterns of the plurality of circuit regions has at least two circuit elements that are switchable between a high impedance state and a pass state, and wirings that are connected to the circuit patterns of circuit regions adjacent to concerned circuit region, among the plurality of circuit regions, wherein states of the at least two circuit elements of the plurality of circuit regions are controlled to be predetermined states determined for each circuit region, so that at least a part of the clock tree crossing the plurality of circuit regions is configured, wherein the circuit pattern includes a plurality of stages of circuit portions configured to take on a plurality of stages of branches of the clock tree, respectively, wherein one circuit portion among the plurality of stages of circuit portions includes first circuit element and second circuit element that are included in the at least two circuit elements and have output ends connected to each other, and wherein the wirings include a first wiring portion for connecting an input end of the first circuit element, to an input end of the second circuit element of a circuit region adjacent to one side of the concerned circuit region, among the plurality of circuit regions, and a second wiring portion for connecting an input end of the second circuit element, to an input end of the first circuit element of a circuit region adjacent to another side of the concerned circuit region, among the plurality of circuit regions.

8. A method for manufacturing a clock transmission circuit including a clock tree provided on a single substrate, the method comprising:

a step of performing stitch exposure to form a plurality of circuit regions that have circuit patterns and are arranged in one direction, wherein each of the circuit patterns of the plurality of circuit regions has at least two circuit elements that are switchable between a high impedance state and a pass state, and wirings that are connected to the circuit patterns of circuit regions adjacent to concerned circuit region, among the plurality of circuit regions, wherein states of the at least two circuit elements of the plurality of circuit regions are controlled to be predetermined states determined for each circuit region, so that at least a part of the clock tree crossing the plurality of circuit regions is configured, wherein the circuit pattern includes a plurality of stages of circuit portions configured to take on a plurality of stages of branches of the clock tree, respectively, wherein at least one circuit portion among the plurality of stages of circuit portions includes third circuit element, fourth circuit element, and fifth circuit element that are included in the at least two circuit elements, wherein an output end of the third circuit element, an input end of the fourth circuit element, and an input end of the fifth circuit element are connected to a second node, wherein an input end of the third circuit element and an output end of the fourth circuit element are connected to a third node, and wherein the wirings include a third wiring portion for connecting the second node, to the third node of a circuit region adjacent to one side of the concerned circuit region, among the plurality of circuit regions, and a fourth wiring portion for connecting the third node, to the second node of a circuit region adjacent to another side of the concerned circuit region, among the plurality of circuit regions.

9. The method for manufacturing a clock transmission circuit according to claim 7, wherein the at least two circuit elements are a TRI-STATE type.

10. The method for manufacturing a clock transmission circuit according to claim 7, wherein, among the at least two circuit elements, a circuit element that configures at least a final stage circuit portion is a TRI-STATE type, and an output end of the circuit element is connected to one or both of a pull-up resistor and a pull-down resistor.

11. The method for manufacturing a clock transmission circuit according to claim 7, wherein, among the at least two circuit elements, a circuit element that configures at least a final stage circuit portion includes a logic circuit.

12. The clock transmission circuit according to claim 2, wherein the at least two circuit elements are a TRI-STATE type.

13. The clock transmission circuit according to claim 2, wherein, among the at least two circuit elements, a circuit element that configures at least a final stage circuit portion is a TRI-STATE type, and an output end of the circuit element is connected to one or both of a pull-up resistor and a pull-down resistor.

14. The clock transmission circuit according to claim 2, wherein, among the at least two circuit elements, a circuit element that configures at least a final stage circuit portion includes a logic circuit.

15. An imaging element comprising:

a pixel array including a plurality of pixels arranged in a one-dimensional or two- dimensional manner;

an analog/digital converter array including a plurality of analog/digital converters configured to convert a plurality of analog signals output from the plurality of pixels into digital signals, respectively;

a memory array having a plurality of storage regions configured to store a plurality of digital signals output from the analog/digital converter array, respectively; and a horizontal scanning circuit configured to sequentially output the plurality of digital signals stored in the memory array, as a serial signal, wherein at least one of the analog/digital converter array and the horizontal scanning circuit receives supply of a clock signal via the clock transmission circuit according to claim 4.

16. The method for manufacturing a clock transmission circuit according to claim 8, wherein the at least two circuit elements are a TRI-STATE type.

17. The method for manufacturing a clock transmission circuit according to claim 8, wherein, among the at least two circuit elements, a circuit element that configures at least a final stage circuit portion is a TRI-STATE type, and an output end of the circuit element is connected to one or both of a pull-up resistor and a pull-down resistor.

18. The method for manufacturing a clock transmission circuit according to claim 8, wherein, among the at least two circuit elements, a circuit element that configures at least a final stage circuit portion includes a logic circuit.

* * * * *